United States Patent [19]

Falk

[11] Patent Number: 4,963,869
[45] Date of Patent: Oct. 16, 1990

[54] PARALLEL RESIDUE TO MIXED BASE CONVERTER

[75] Inventor: R. Aaron Falk, Renton, Wash.

[73] Assignee: The Boeing Company, Seattle, Wash.

[21] Appl. No.: 414,474

[22] Filed: Sep. 29, 1989

[51] Int. Cl.$^5$ .................... H03M 7/18; H03M 7/12
[52] U.S. Cl. ........................ 341/83; 364/713; 364/746; 250/227.28; 250/213 A
[58] Field of Search ............... 341/82, 83; 364/713, 364/746; 250/213 A, 551, 227; 356/435

[56] References Cited

U.S. PATENT DOCUMENTS

| | | | |
|---|---|---|---|
| 3,132,334 | 5/1964 | Williams | 341/82 |
| 3,267,461 | 8/1966 | Harmon | 341/83 |
| 4,107,783 | 8/1978 | Huang | 364/746 |
| 4,281,391 | 7/1981 | Huang | 364/746 |
| 4,506,151 | 3/1985 | MacDonald et al. | 250/213 A |
| 4,528,641 | 7/1985 | Burrows | 364/757 |
| 4,567,355 | 1/1986 | Schuoecker et al. | 341/83 |
| 4,709,345 | 11/1987 | Vu | 364/746 |
| 4,752,904 | 1/1988 | Paul | 364/746 |
| 4,770,483 | 9/1988 | Ridgway | 364/713 |
| 4,797,843 | 1/1989 | Falk et al. | 364/713 |
| 4,857,762 | 8/1989 | Gaebel | 250/551 |

OTHER PUBLICATIONS

Psaltis, Applied Optics, vol. 18, No. 2, Jan. 15, 1979, pp. 163–171.
Huang et al., "Optical Computation Using Residue Application", Applied Optics, vol. 18, No. 2, Jan. 15, 1979, pp. 149–162.
Szabo, N. S., M.S. etc., "Residue Arithmetic and its Applications to Computer Technology", McGraw-Hill Book Company, New York, 1967, pp. 34–51.
Taylor, F. J., "Residue Arithmetic: A Tutorial with Examples", Computer, vol. 17, No. 5, pp. 50–62 (May 1984).

Primary Examiner—William M. Shoop, Jr.
Assistant Examiner—Howard L. Williams
Attorney, Agent, or Firm—Foley & Lardner, Schwartz, Jeffery, Schwaab, Mack, Blumenthal & Evans

[57] ABSTRACT

A residue number system to mixed base number system converter includes one or more digit converters arranged in parallel. Each digit converter includes sources, interconnects, detectors, and threshold detectors. The interconnects are arranged and trigger values of the threshold detectors are selected to accomplish conversion from inputted residue digits to outputted mixed base digits. The system may be implemented using electronic or optical technologies.

17 Claims, 6 Drawing Sheets

FIG. 1

| DECIMAL NUMBER | RESIDUE NUMBER | | | MIXED BASE NUMBER | | |
|---|---|---|---|---|---|---|
| | $r_3$ ($m_3=5$) | $r_2$ ($m_2=3$) | $r_1$ ($m_1=2$) | $a_3$ $w_3=6$ | $a_2$ $w_2=2$ | $a_1$ $w_1=1$ |
| 0 | 0 | 0 | 0 | 0 | 0 | 0 |
| 1 | 1 | 1 | 1 | 0 | 0 | 1 |
| 2 | 2 | 2 | 0 | 0 | 1 | 0 |
| 3 | 3 | 0 | 1 | 0 | 1 | 1 |
| 4 | 4 | 1 | 0 | 0 | 2 | 0 |
| 5 | 0 | 2 | 1 | 0 | 2 | 1 |
| 6 | 1 | 0 | 0 | 1 | 0 | 0 |
| 7 | 2 | 1 | 1 | 1 | 0 | 1 |
| 8 | 3 | 2 | 0 | 1 | 1 | 0 |
| 9 | 4 | 0 | 1 | 1 | 1 | 1 |
| 10 | 0 | 1 | 0 | 1 | 2 | 0 |
| 11 | 1 | 2 | 1 | 1 | 2 | 1 |
| 12 | 2 | 0 | 0 | 2 | 0 | 0 |
| 13 | 3 | 1 | 1 | 2 | 0 | 1 |
| 14 | 4 | 2 | 0 | 2 | 1 | 0 |
| 15 | 0 | 0 | 1 | 2 | 1 | 1 |
| 16 | 1 | 1 | 0 | 2 | 2 | 0 |
| 17 | 2 | 2 | 1 | 2 | 2 | 1 |
| 18 | 3 | 0 | 0 | 3 | 0 | 0 |
| 19 | 4 | 1 | 1 | 3 | 0 | 1 |
| 20 | 0 | 2 | 0 | 3 | 1 | 0 |
| 21 | 1 | 0 | 1 | 3 | 1 | 1 |
| 22 | 2 | 1 | 0 | 3 | 2 | 0 |
| 23 | 3 | 2 | 1 | 3 | 2 | 1 |
| 24 | 4 | 0 | 0 | 4 | 0 | 0 |
| 25 | 0 | 1 | 1 | 4 | 0 | 1 |
| 26 | 1 | 2 | 0 | 4 | 1 | 0 |
| 27 | 2 | 0 | 1 | 4 | 1 | 1 |
| 28 | 3 | 1 | 0 | 4 | 2 | 0 |
| 29 | 4 | 2 | 1 | 4 | 2 | 1 |

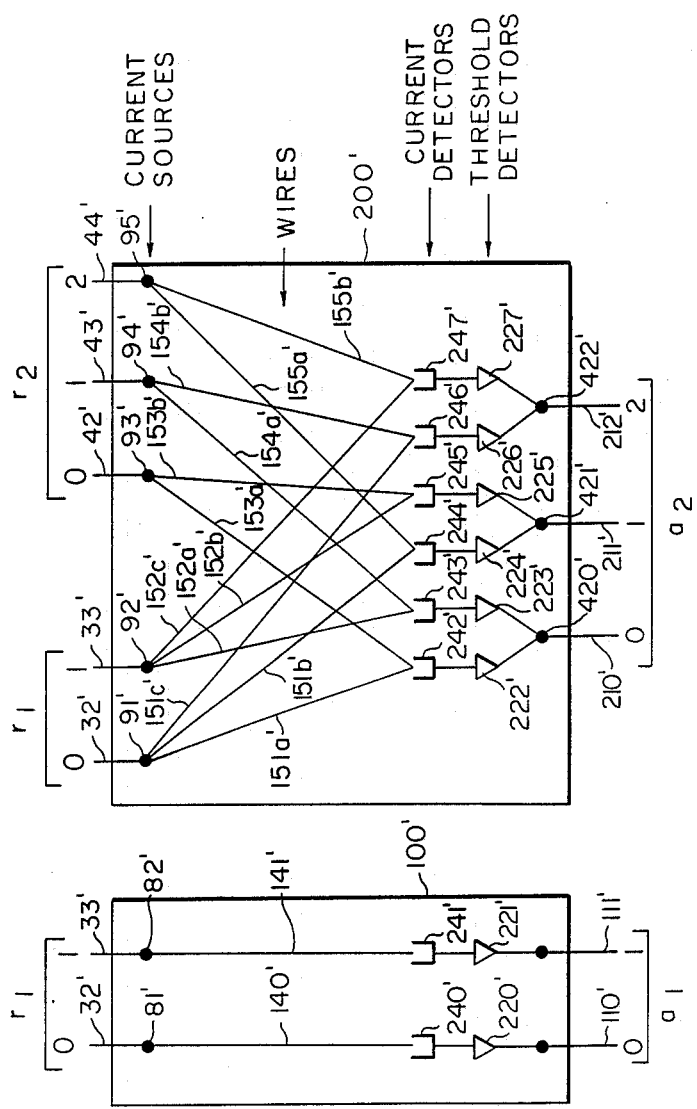

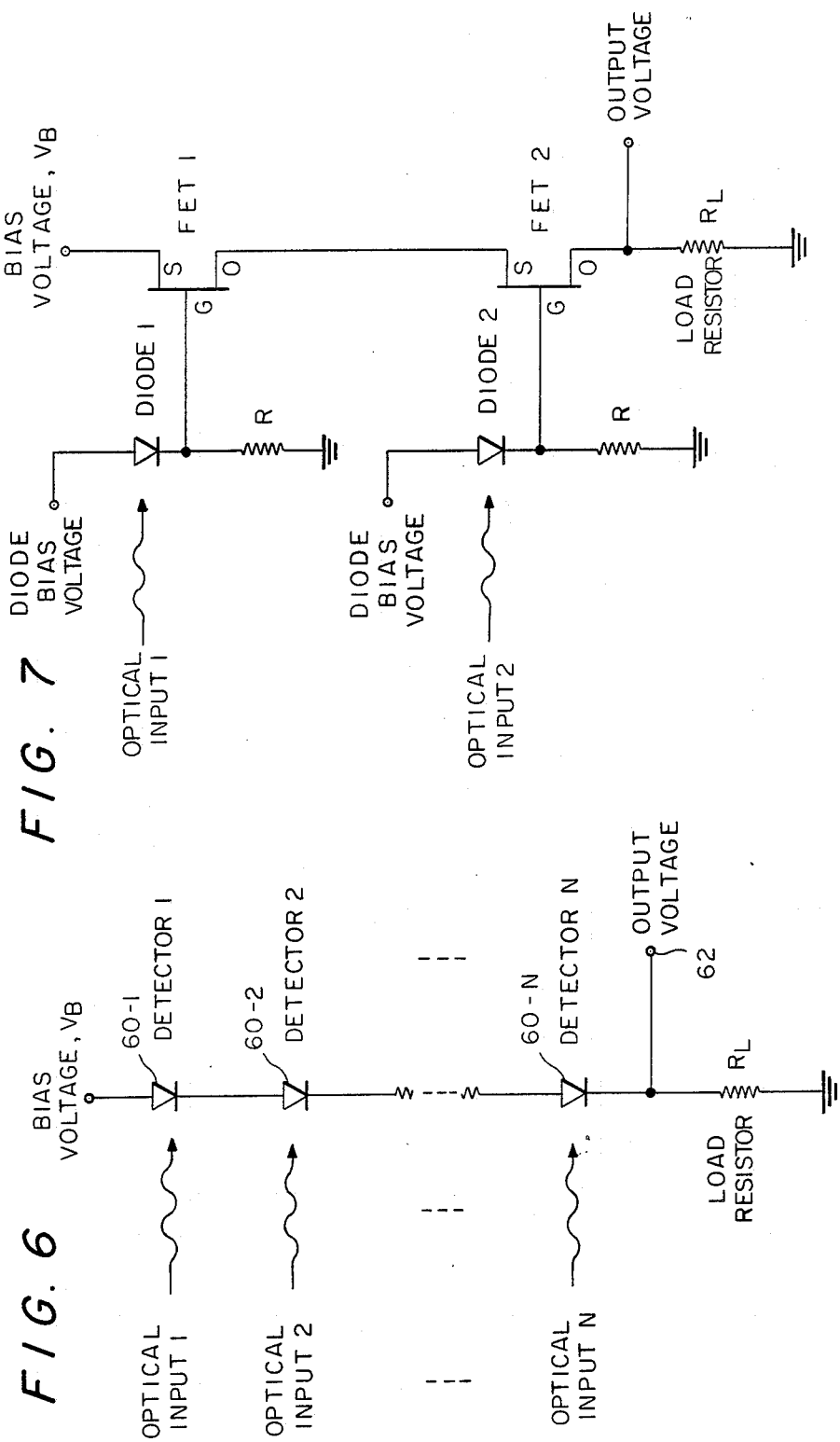

PARALLEL RESIDUE TO MIXED BASE CONVERTER

BACKGROUND OF THE INVENTION

The invention is in the field of information processing. Specifically, the invention relates to conversion from residue number system (RNS) representations of data to mixed base number system representations of data using a parallel residue to mixed base converter.

The RNS has received considerable attention in recent times as an effective tool for performing single step, parallel computation of sums, differences, and products. A system employing the RNS may be used for high speed, real time, parallel processing of data.

A difficulty associated with actually achieving fast computation with the RNS is that an RNS representation of a number does not provide explicit sign and magnitude information. This sign/magnitude problem could be solved by converting the number from RNS representation to fixed based representation using the implicit sign and magnitude information of the fixed based system. Unfortunately, this fixed base conversion process is very time consuming due to the need to multiply large fixed base numbers. An alternative is to convert the RNS representation into mixed base representation.

*Residue Arithmetic and Its Application to Computer Technology.* N. S. Szabo and R. I. Tanaka, (McGraw Hill, New York, 1967) and "Residue Arithmetic: A Tutorial with Examples," F. J. Taylor *Computer* Vol. 17 No. 5, pp. 50-62 (May 1984), both of which are hereby incorporated by reference, provide general background information on the RNS and the mixed base number system. Rapid conversion from RNS representation to mixed base representation is important for sign/magnitude comparison as well as for overflow detection and rescaling.

The Szabo and Tanaka text provides procedures for converting between RNS representations and mixed base representations. Unfortunately, these procedures require performance of a time consuming sequence of arithmetic operations. A slow conversion process decreases the efficiency of an associated information processing system and is thus undesirable.

U.S. Pat. Nos. 4,107,783 issued to Huang, 4,752,904 issued to Paul, 4,709,345 issued to Vu, 4,528,641 issued to Burrows, and 4,281,391 issued to Huang disclose residue to mixed base converters which use ROMs (read only memory) and latches, adders, or processors to implement the conversion process. The inventions disclosed in these patents perform the conversion process in a time consuming series of pipelined stages and require complex hardware, and are thus unsuitable for many applications due to the long period of time required for the pipelined conversion process and the complexity of the hardware required. Accordingly, there is a need for high speed RNS representation to mixed base representation converters.

SUMMARY OF THE INVENTION

It is an object of the invention, therefore, to provide a high speed parallel residue to mixed base converter.

Another object of the invention is to provide a residue to mixed base converter which does not require complex hardware, such as ROMs, adders, or processors.

Another object of the invention is to provide a residue to mixed base converter which uses optical technologies to realize an efficient converter.

A further object of the invention is to accomplish residue to mixed base conversion in a single step.

In accordance with one aspect of the invention there is provided a residue to mixed base converter including one or more digit converters arranged in parallel. Each digit converter receives at least one residue digit and outputs a mixed base digit. All of the mixed base digits are outputted at essentially the same time. Each digit converter has several sources grouped in residue groups corresponding to a residue digit. Exactly one source within each residue group is activated at one time. The activated source is indicative of the value of the residue digit associated with that residue group. Interconnects are provided in each digit converter for connecting the sources to several detectors. Each interconnect transmits a signal from an associated source, to an associated detector when the associated source is activated. Each detector is connected to at least one interconnect and is set to trigger at predetermined signal level values. The detectors are also grouped into mixed base groups corresponding to a value of the mixed base digit associated with that particular digit converter. The trigger values are selected and the interconnects are arranged such that exactly one detector within each digit converter triggers, indicating the output value of the mixed base digit associated with that digit converter.

BRIEF DESCRIPTION OF THE DRAWINGS

The invention is described below with reference to the accompanying drawings, wherein:

FIG. 1 is a table illustrating decimal, residue, and mixed base representations of the decimal numbers 0 through 29;

FIG. 5 illustrates an electronic implementation of the first digit converter and the second digit converter of FIG. 3;

FIG. 6 illustrates a first embodiment of a multiple input AND logic circuit; and FIG. 7 illustrates a second embodiment of a multiple input AND logic circuit.

DETAILED DESCRIPTION OF THE PREFERRED EMBODIMENTS

Figure 2:
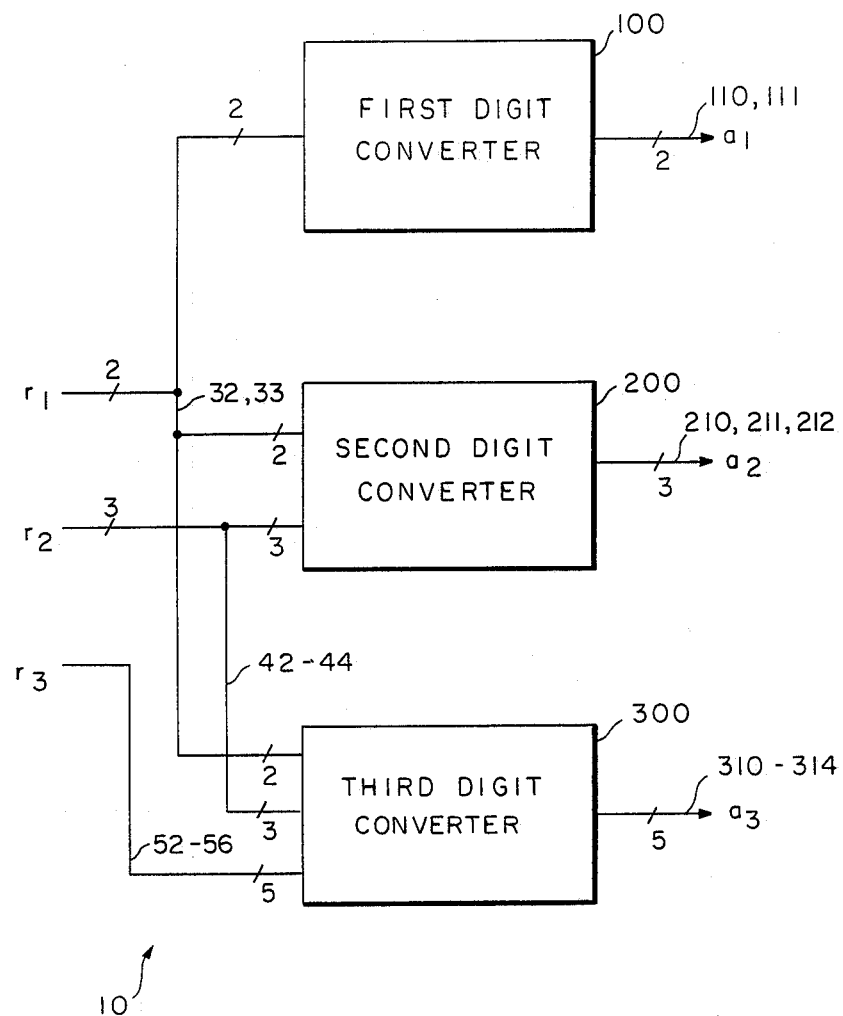
FIG. 2 is a block diagram of residue to mixed base converter according to a preferred embodiment of the invention.

An integer is represented in the RNS by writing down an n-tuple where the $i^{th}$ digit is the remainder, $r_i$, after division of the integer by an associated modulus, $m_i$. FIG. 1 lists RNS representations of the decimal numbers 0 to 29, when the moduli are 2, 3, and 5. For example, the decimal number 7 is represented as 211 in RNS representation. If the moduli are chosen to be mutually prime, then all integers within the range of zero to the product of the moduli minus one can be uniquely represented.

The importance of the residue number system to numerical processing is that the operations of addition, subtraction, and multiplication can be performed without the use of carry operations between the moduli. In other words, each digit in the n-tuple can be operated on independently and in parallel For example, if two n-tuples X, having digits $x_1 \ldots x_n$, and Y, having digits $y_1 \ldots y_n$, are added to produce Z, having digits $z_1 \ldots z_n$, then the $i^{th}$ digit is given by:

$$z_i = (x_i + y_i) \bmod m_i \tag{1}$$

The mod function takes the number in front of "mod," in this case $x_i + y_i$, and divides this number by the number after "mod," in this case $m_i$, and substitutes the remainder for the entire function.

The power of RNS representation is that an operation on large numbers can be broken down into small parallel modular operations. For example, a sixteen bit binary number can be represented in the residue number system using the five moduli 5, 7, 11, 13 and 17. Multiplication of two 16 bit binary numbers produces a 32 bit intermediate result and requires 31 carry operations. In contrast, modular arithmetic devices can perform the same multiplication operation in a single parallel step without any carry operations.

The high speed potential of RNS arithmetic may be effectively exploited by optical computers that excel at parallel operations. Optical computers making use of RNS arithmetic promise at least an order of magnitude improvement in computational speed over standard electronic, binary computers.

A difficulty with the RNS representation is that magnitude comparisons can not be determined by a simple one-to-one digit comparison. For example, as seen from FIG. 1, in RNS representation the decimal number 16, which is represented in RNS representation as 110, appears smaller than the decimal number 8, which is represented in RNS representation as 320. In order to implement a general purpose computer, sign, magnitude, and overflow detection is required.

One method of providing sign, magnitude, and overflow information is to convert numbers from RNS representation into mixed base representation. A number X may be expressed in mixed base form according to the following equations:

$$X = \sum_{j=1}^{N} a_j W_j \tag{2}$$

where:

$$w_j = \prod_{i=1}^{j-1} m_i \quad j \geq 2 \tag{3}$$
$$w_1 = 1 \quad j = 1$$

so that:

$$X = a_N \prod_{i=1}^{N-1} m_i + \ldots + a_3 m_1 m_2 + a_2 m_1 + a_1 \tag{4}$$

The terms $w_1, \ldots, w_j$ are the bases and are related to the moduli of an associated RNS representation. The terms $a_1, \ldots, a_N$ are the mixed base digits. Any positive integer in the interval $$\left[ 0, \prod_{i=1}^{N} m_i - 1 \right]$$

may be represented in accordance with equation (4) and each integer has a unique representation. FIG. 1 lists the mixed base digits for decimal numbers 0 through 29. In FIG. 1, $w_1$ is 1, $w_2$ is the modulus 2, and $w_3$ is , the product of the modulus 2 and the modulus 3. Thus the decimal 10 number 10 is represented as 120, where $a_1$ is 0, $a_2$ is 2, and $a_3$ is 1.

A mixed base system can be arranged such that:

$$a_j < m_j \tag{5}$$

resulting in the property that:

$$|w_{k+1}| > \left| \sum_{j=1}^{k} a_j w_j \right| \tag{6}$$

The arrangement of Equation (5) results in an ordered sequencing of the mixed base digits. As can be seen from Equation (6), this ordered sequencing allows direct magnitude determination by a comparison of the digits. For example, the mixed base number 220, decimal number 16, can be readily determined to be greater than the mixed base number 110, decimal number 8, since the most significant digit of 220 is greater than the most significant digit of 110.

An additional property of the mixed base digits is that the $j^{th}$ digit is determined from the remainder, or residue, entries for which $i \leq j$. That is $a_1$ can be determined from $r_1$, $a_2$ can be determined from $r_1$ and $r_2$, and so on. When taken advantage of in a converter design, this property results in a significantly less complex converter design.

Optical processing systems are disclosed in U.S. Pat. No. 4,797,843, issued Jan. 10, 1989, entitled "Parallel Optical Arithmetic/Logic Unit;" and in co-pending applications Ser. No. 07/019,761 filed Feb. 27, 1987, entitled "Optical Cross Bar Arithmetic/Logic Unit;" Ser. No. 07/219,392, filed July 15, 1988, entitled "Optical Computer Including Pipelined Conversion of Numbers to Residue Representation;" and Ser. No. 07/233,610, filed Aug. 18, 1988, entitled "Optical Computer Including Parallel Residue to Binary Conversion," and are all incorporated herein by reference. The present invention may be used in conjunction with the inventions disclosed in the above-cited patent and co-pending applications.

A preferred embodiment of a residue to mixed base converter 10 according to the present invention is illustrated in FIG. 2. The digits of the RNS representation are $r_1$, $r_2$, and $r_3$. Using the example of FIG. 1, the digits $r_1$, $r_2$, and $r_3$ correspond to L- moduli of 2, 3, and 5 respectively. The $r_1$ digit is provided to a first digit converter 100, a second digit converter 200, and a third digit converter 300 via signal lines 32 and 33. The $r_2$ digit is provided to a second digit converter 200 and third digit converter 300 via signal lines 42-44. The $r_3$ digit is provided to third digit converter 300 via signal lines 52-56.

As will be described further below, the digit converters 100, 200, and 300 convert the RNS digits $r_1$, $r_2$, and $r_3$ into mixed base digits $a_1$, $a_2$, and $a_3$. These mixed base digits are output via electrical signal lines 110, 111, 210–212, and 310–314 for use, for example, in sign and magnitude determination.

Figure 3:
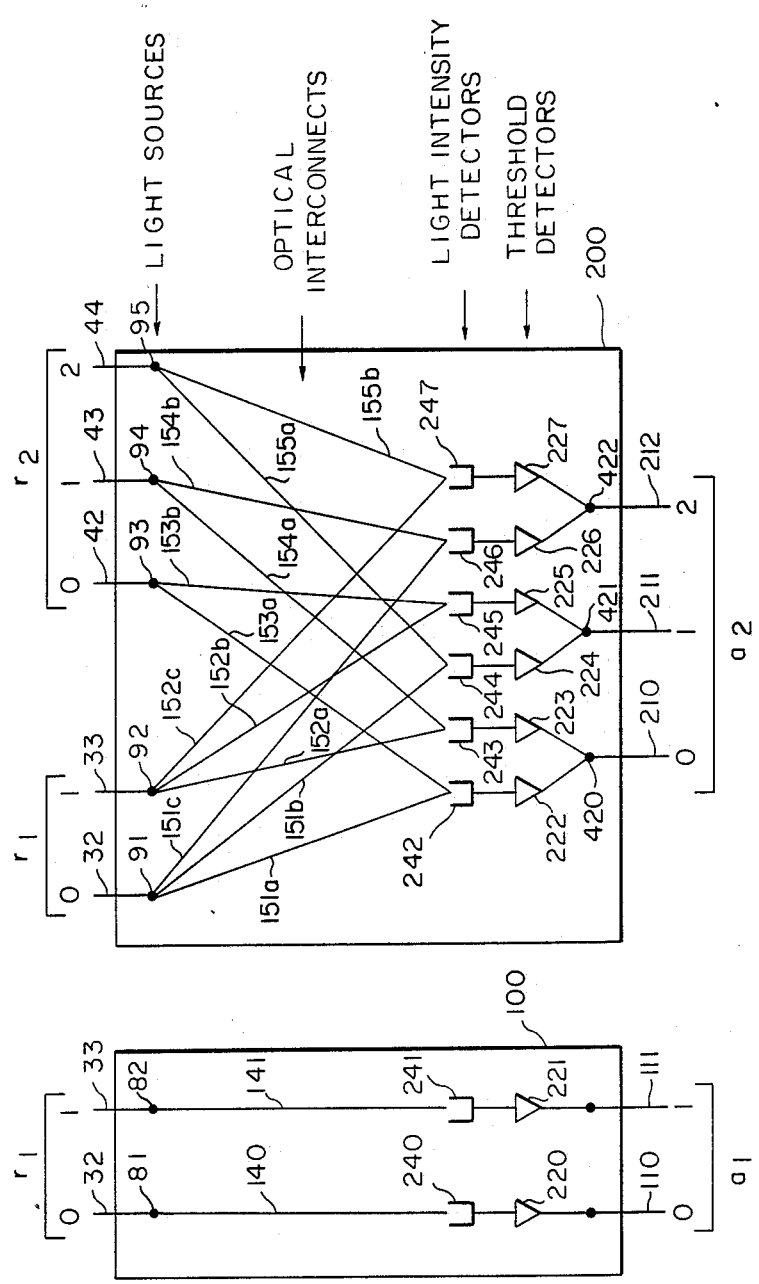
FIG. 3 illustrates a design of the first and second digit converters shown in FIG. 2.

FIG. 3 illustrates the first and second digit converters 100 and 200. First digit converter 100 will be discussed first to illustrate the basic construction and operation of the digit converters. The value of the $r_1$ digit is transmitted by signal lines 32 and 33. Only one of signal lines 32 and 33 is activated, for example by being connected to a voltage source, at any one time. Signal line 32 is activated when $r_1$ is 0. Signal line 33 is activated when $r_1$ is 1. Thus, the residue $r_1$ is provided in a positional representation. Signal line 32 is connected to light source 81 and signal line 33 is connected to light source 82. When signal line 32 is activated, light source 81 transmits light of intensity I along optical interconnect 140 to light intensity detector 240. Optical interconnect 140 can be an optical fiber or an optical waveguide, for example. Detector 240 produces an electrical signal proportional to the intensity of light received and transmits this electrical signal to threshold detector 220. If the electrical signal received by threshold detector 220 corresponds to a light intensity of I, the threshold detector 220 will be triggered. When the threshold detector 220 triggers, an electrical signal is transmitted on signal line 110 to indicate that the value of $a_1$ is zero. Signal line 33, light source 82, optical interconnect 141, light intensity detector 241, threshold detector 221, and signal line 111 operate in a manner similar to described above. Thus, the first digit converter 100 outputs an $a_1=0$ signal whenever $r_1=0$, and outputs an $a_1=1$ signal whenever $r_1=1$. The correctness of this digit conversion process can be verified by inspection of the $r_1$ and $a_1$ columns of FIG. 1.

The second digit converter 200 operates in a manner similar to the first digit converter 100. The value of the $r_1$ digit is transmitted to the second digit converter 200 via signal lines 32 and 33. The value of the $r_2$ digit is transmitted to the second digit converter 200 via signal lines 42, 43, and 44. Only one of the signal lines 42, 43, and 44 is activated at any instant again providing a positional representation.

Signal lines 32 and 33 are connected to light sources 91 and 92 respectively. Signal lines 42, 43, and 44 are connected to light sources 93, 94, and 95 respectively. Unlike the first digit converter 100, the light sources in the second digit converter 200 each transmit light down more than one optical interconnect and the light intensity detectors can receive light from more than one optical interconnect. For example, light source 93 transmits light down optical interconnect 153a and down optical interconnect 153b. The intensities of light received at a light intensity detector are additive. The size of the optical interconnects typically do not have the same cross-sectional area, but may be selected such that the light intensity travelling along any optical interconnect is identical. The light intensity along any single optical interconnect will be referred to as I. Alternately or additionally, to achieve an intensity of I along each optical interconnect, light sources of different intensities, for example light emitting diodes (LEDs) of different intensities, may be used. Filters provided between the light sources and the optical interconnects may also be used to achieve an intensity of I along each optical interconnect.

The optical interconnect pattern shown in FIG. 3 is a simple repetitive pattern. The number of light intensity detectors employed in a given digit converter is equal the product of the moduli associated with that given digit converter. For example, the second digit converter 200 has an $r_1$ input, corresponding to a modulus of 2, and an $r_2$ input, corresponding to a modulus of 3. Therefore, the second digit converter 200 has six light intensity detectors. In each digit converter the light sources corresponding to a 0 RNS digit value are connected to a first light intensity detector. For example, for the second digit converter 200, light sources 91 and 93, corresponding to $r_1=0$ and $r_2=0$, are connected to light intensity detector 242 via optical interconnects 151a and 153a. Then the light sources corresponding to a 0 RNS digit value are connected to every $k^{th}$ light intensity detector until the last detector is reached; where k is the modulus of the associated RNS input digit. For example, the $r_1$ RNS input digit is associated with a modulus of 2, therefore k is 2 with respect to the optical interconnects associated with the $r_1$ digit. The $r_2$ RNS input digit is associated with a modulus of 3, therefore k is 3 with respect to the optical interconnects associated with the $r_2$ digit. Therefore, light source 91 is connected to every second light intensity detector, i.e., to light intensity detector 244 via optical interconnect 151b and to light intensity detector 246 via optical interconnect 151c. Similarly, light source 93 is connected to every third light intensity detector, i.e., to light intensity detector 245 via optical interconnect 153b.

In a similar fashion, the light sources corresponding to a 1 RNS digit value are connected using the same pattern except that the pattern begins with a second light intensity detector instead of the first light intensity detector. For example, in the second digit converter 200, light sources 92 and 94 are connected to light intensity detector 243 and the pattern is repeated down the row of light intensity detectors.

In the second digit converter 200, each light intensity detector 242–247 provides an electrical signal to a corresponding threshold detector 222–227 that is proportional to the intensity of the light that is received. The threshold detectors for the second digit converter are all set to trigger when they receive an electrical signal corresponding to a light intensity of 2I. If a threshold detector receives an electrical signal corresponding to an intensity of less than 2I, the threshold detector will not trigger. In general, the threshold detectors of the first (least significant) digit converter 100 trigger at I, the threshold detectors of the second digit converter 200 trigger at 2I, the threshold detectors of the third digit converter 300 trigger at 3I, and so on. Pairs of outputs of the threshold detectors 222–227 are OR'ed together using OR circuits 420, 421, and 422. The outputs from the OR circuits 420, 421, and 422 are transmitted via signal lines 210, 211, and 212 for use, for example, by a computer. The structure of the second digit converter 200 described above results in the conversion of RNS digits $r_1$ and $r_2$ into mixed base digit $a_2$.

The following example will illustrate overall operation of the first digit converter 100 and the second digit converter 200. For the purpose of this example, the third RNS digit $r_3$ and the third mixed base digit $a_3$ will be ignored. In this example, the decimal number 5 will be converted from RNS representation, $r_1=1$ and $r_2=2$, to mixed base representation. In the first digit converter 100 signal line 33 is activated to transmit light of intensity I along optical interconnect 141 to light intensity detector 241. Light intensity detector 241 transmits an electrical signal corresponding to an intensity of I to threshold detector 221. Threshold detector 221 is triggered to generate a signal on signal line 111 indicating that $a_1$ is 1. Since signal line 32 was not activated, no light was transmitted along optical interconnect 140, threshold detector 220 does not trigger, and therefore no signal is transmitted from signal line 110.

In the second digit converter 200, signal line 33 causes light source 92 to transmit light along optical interconnects 152a, 152b, and 152c. The $r_2=2$ signal on signal line 44 causes light source 95 to transmit light along optical interconnects 155a and 155b.

Light intensity detectors 242 and 246 will not receive any light since none of the optical interconnects connected to light intensity detectors 242 and 246 are lighted. Therefore, threshold detectors 222 and 226 will not trigger.

Light intensity detectors 243, 244, and 245 will receive light of intensity I since exactly one of the optical interconnects connected to each of these detectors is lighted. Since all of the threshold detectors in second digit converter 200 are set to trigger at an electrical signal corresponding to light of intensity 2I, the threshold detectors 223, 224, and 225 associated with light intensity detectors 243, 244, and 245 will not trigger.

Light intensity detector 247 receives light from optical interconnects 152c and 155b. The intensity of light from each of these optical interconnects is additive, therefore light intensity detector 247 detects light of intensity 2I and transmits an electrical signal to threshold detector 227 corresponding to a light intensity of 2I. Since threshold detector 227 is set to trigger at an electrical signal corresponding to a light intensity of 2I, threshold detector 227 triggers. When threshold detector 227 triggers, an electrical signal is outputted via OR circuit 422 and signal line 212 indicating that $a_2$ is 2. Signal lines 210 and 211 do not transmit a signal since the threshold detectors associated with these signal lines were not triggered.

Figure 4:
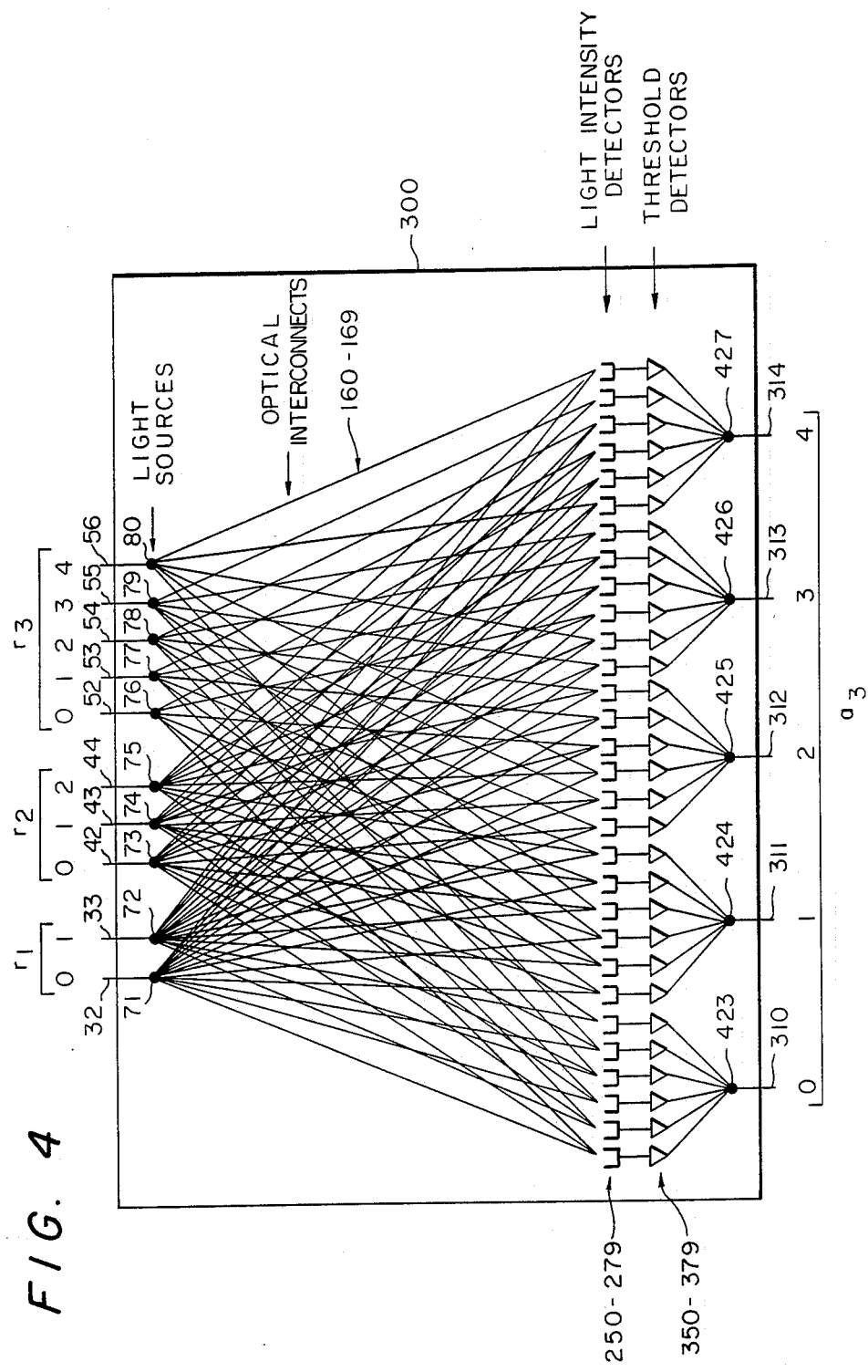
FIG. 4 illustrates a design of the third digit converter shown in FIG. 2.

FIG. 4 illustrates the third digit converter 300. The third digit converter 300 is constructed according to the method described above with respect to the second digit converter 200. In FIG. 4, RNS input digits $r_1$, $r_2$, and $r_3$ are used to determine mixed base digit $a_3$. The third digit converter 300 includes signal lines 32–33, 42–44, and 52–56; light sources 71–80; optical interconnects 160–169; light intensity detectors 250–279; threshold detectors 350–379; OR circuits 423–427; and signal lines 310–314.

The outputs of the residue to mixed base converter 10 can be used directly for magnitude and sign determination or for other purposes. The residue to mixed base converter 10 is particularly well-suited to applications where delay time must be minimized.

It is understood that the techniques and construction described above are not limited to applications involving three mixed base digits or to applications involving RNS moduli of 2, 3, and 5. The techniques and constructions described above are generally applicable to an arbitrary number of mixed base digits and to arbitrary RNS moduli. Also, it is understood that if the RNS input signals are in optical form, then the light sources may be omitted. While electronic detection and thresholding has been described, all optical thresholding using optical non-linear devices can also be used. Pairs of radices may be precombined as shown in FIG. 37 of the 07/233,610 co-pending application cited above.

In addition, the light sources, the optical interconnects, and the light intensity detectors may be replaced with corresponding electronic elements. For example, the light sources could be replaced with current sources, the optical interconnects with wires or transmission lines, and the light intensity detectors with current detectors. In this electronic embodiment, each current source would send a current I along each wire. The current at the current detectors would then be the sum of the currents from each wire. FIG. 5 illustrates an electronic implementation of the first digit converter 100 and the second digit converter 200. In FIG. 5 primed numbers are utilized to correspond to analogous elements of FIG. 3.

The preferred embodiments described above require light intensity and threshold detectors which must discriminate between several levels of incident light intensity. For example, light intensity detectors 250–279 and threshold detectors 350–379 must discriminate between an intensity of 2I and an intensity of 3I. For practical reasons, the use of detectors which only need discriminate between an intensity of 3I and an intensity of 2I may be preferred. In this case, the use of a multistep cascade, or precombination, process as described in co-pending application 07/233,610, cited above, rather than a single step process may be used.

An alternate embodiment for each of the detectors 240–247 and 250–279 and their respective corresponding threshold circuits 220–227 and 350–379, is to utilize a multiple-input, opto-electronic AND gate configuration such as shown in FIG. 6, wherein photoconductive detectors 60-1 through 60-N are connected in series. A load resistor $R_L$ is connected between detector 60-N and ground, and an output terminal 62 is provided between detector 60-N and load resistor $R_L$. The opto-electronic AND gate configuration shown in FIG. 6 replaces each intensity detector and threshold circuit pair shown in FIG. 4.

The operation of the circuit illustrated in FIG. 6 may be considered first in reference to a simple case where $N=2$. If each detector 60-1 and 60-2 is operated away from saturation, then detector resistance can be modeled by:

$$R_i = \frac{\alpha}{P_I + P_D} \qquad (7)$$

where $R_1$ is the detector resistance of detector 60-i $\alpha$ is a parameter with a typical value of 100 ohms-watt, $P_D$ is a dark power relating to the detector dark current with a typical value of $10^{-7}$ watts and $P_I$ is the input power. The voltage across the load resistor $R_L$ is therefore given by:

$$V_o = V_B R_L/(R_L + R_1 R_2) \qquad (8)$$

If the load resistor $R_L$ is chosen so that when light is present on none or only one of the detectors, the condition:

$$R_L << R_1 + R_2 \approx \frac{\alpha}{P_D} \qquad (9)$$

is true, and when both detectors are illuminated the condition:

$$R_L >> R_1 + R_2 = \frac{2\alpha}{P_I} \qquad (10)$$

is true, then the output voltage will be zero and the bias voltage, respectively. Thus, the circuit operates as an AND gate. For the applications of interest, both inputs are of equal value and may be scaled together in magnitude so that conditions (9) L and (10) can always be met. For the multi-input AND gate shown in FIG. 6, conditions (9) and (10) become:

$$R_L << R_1 + R_2 + \ldots R_N \approx \frac{a}{P_D} \quad (11)$$

$$R_L >> R_1 + R_2 + \ldots R_N = \frac{Na}{P_D} \quad (12)$$

For additional gain enhancement, a variation of the circuit of FIG. 6 for two detectors using FETs is illustrated in FIG. 7. The operation of this circuit relies on the variable resistance of the FETs with input voltage and is otherwise similar to the circuit described with respect to FIG. 6. The circuit illustrated in FIG. 7 may be straightforwardly extended for multiple inputs. Other variations on both circuits are possible, with the basic operation relying on multiple series resistances that vary with input illumination. An all optical AND gate, such as described in copending application 07/414,475 filed Sept. 29, 1989 and entitled "Optical AND Gate For Use In A Cross-Bar Arithmetic/Logic Unit" by R. A. Falk (Attorney Docket No. 16753/138), can also be used analogously to the opto-electronic AND gate configuration described above.

The foregoing description has been set forth merely to illustrate preferred embodiments of the invention and is not intended to be limiting. Since modification of the described embodiments incorporating the spirit and substance of the invention may occur to persons skilled in the art, the scope of the invention should be limited solely with respect to the appended claims and equivalents.

What is claimed is:

1. A parallel residue to mixed base converter for converting an input number, expressed in residue number system (RNS) representation as a plurality of residue digits, into an output number, expressed in mixed base number system representation as a plurality of mixed base digits, said parallel residue to mixed base converter comprising:
   a plurality of digit converters arranged in parallel, each of said plurality of digit converters receiving at least one residue digit associated with at least one moduli of said RNS representation and outputting a mixed base digit;
   each of said plurality of digit converters further comprising:
   a plurality of sources grouped into residue groups, each residue group corresponding to a residue digit and arranged such that exactly one source within each residue group is activated at one time, said activated source indicative of the value of a residue digit associated with that residue group; and
   a plurality of interconnects, each of said plurality of interconnects connected at one end to one of said plurality of sources and connected at another end to one of a plurality of detectors; each of said plurality of interconnects transmitting a signal to a connected detector when said connected source is activated;
   each of said plurality of detectors being connected to at least one of said plurality of interconnects;
   each of said plurality of detectors being set to trigger at trigger values upon receiving said signals and being grouped into mixed base groups such that each mixed base group corresponds to a value of a mixed based digit;
   said trigger values selected and said interconnects arranged such that exactly one of said plurality of detectors within each digit converter triggers at any one instant and such that said exactly one of said plurality of detectors within each digit converter indicates an output value of a mixed base digit.

2. A parallel residue to mixed base converter as set forth in claim 1, further comprising:
   a plurality of OR circuits, each of said plurality of OR circuits connected to said plurality of detectors within a mixed base group and generating an output value when one of said plurality of detectors within a mixed base group triggers.

3. A parallel residue to mixed base converter as set forth in claim 1, wherein all of said plurality of mixed base digits are outputted at essentially the same time.

4. A parallel residue to mixed base converter as set forth in claim 1, wherein:
   said plurality of sources generate or transmit electrical signals;
   said plurality of interconnects transmit electrical signals; and
   said plurality of detectors detect electrical signals.

5. A parallel residue to mixed base converter as set forth in claim 4, wherein:
   the number of sources within each of said plurality of digit converters is equal to the sum of residue number system moduli associated with that digit converter;
   the number of detectors within each of said plurality of digit converters is equal to the product of residue number system moduli associated with that digit converter;
   detectors within a digit converter are set to trigger at trigger values of N. I, N corresponding to the significance of the mixed base digit associated with that digit converter and I corresponding to a magnitude of an electrical signal generated from a source; and
   sources associated with residue number values of q are connected to a (q+1)-th detector and every k-th detector from said (q+1)-th detector, k being the modulus of an associated residue digit.

6. A parallel residue to mixed base converter as set forth in claim 1, wherein:
   said plurality of sources generate or transmit optic signals;
   said plurality of interconnects transmit optic signals; and
   said plurality of detectors detect optic signals.

7. A parallel residue to mixed base converter as set forth in claim 5, wherein each of said plurality of interconnects transmits a signal of intensity I.

8. A parallel residue to mixed base converter as set forth in claim 5, wherein:
   the number of sources within each of said plurality of digit converters is equal to the sum of residue number system moduli associated with that digit converter;
   the number of detectors within each of said plurality of digit converters is equal to the product of residue number system moduli associated with that digit converter;

detectors within a digit converter are set to trigger at trigger values of N. I, N corresponding to the significance of the mixed base digit associated with that digit converter and I corresponding to an intensity of an optic signal generated from a source; and sources associated with residue number values of q are connected to a (q+1)-th detector and every k-th detector from said (q+1)-th detector, k being the modulus of an associated residue digit.

9. A parallel residue to mixed base converter as set forth in claim 8, wherein each of said plurality of detectors further comprises;

a first detector portion which receives incident optic signals and generates an intermediate electrical signal corresponding to said incident optic signals; and a second detector portion which receives said intermediate electrical signal and which triggers based on a magnitude of said intermediate electrical signal.

10. A parallel residue to mixed base converter as set forth in claim 8, wherein each of said detectors is an opto-electronic AND gate.

11. A parallel residue to mixed base converter as set forth in claim 10, wherein said opto-electronic AND gate comprises a plurality of photoconductive detectors configured in series between a voltage source and an output terminal, and a load resistor located between said output terminal and a ground.

12. A parallel residue to mixed base converter as set forth in claim 10, wherein said opto-electronic AND gate comprises a plurality of Field Effect Transistors (FETs) configured in series between a voltage source and an output terminal, and a load resistor located between said output terminal and a ground, and wherein each gate electrode of said plurality of FETs is coupled to a corresponding one of a plurality of input circuits.

13. A parallel residue to mixed base converter as set forth in claim 12, wherein each input circuit comprises a series connection of a diode bias voltage source, a diode, a resistor, and ground, gate electrodes being connected to a terminal of said diode in a corresponding one of said input circuits.

14. A method of converting an input number, expressed in residue number system representation as a plurality of residue digits, into an output number, expressed in mixed base number system representation as a plurality of mixed base digits, said method comprising the steps of:

receiving signals corresponding to values of said residue digits in a plurality of digit converters, said plurality of digit converters including a plurality of sources;

activating sources associated with values of said residue digits, said activated sources being a subset of said plurality of sources;

transmitting signals from each activated source to a plurality of detectors via a plurality of interconnects, said plurality of detectors and said plurality of interconnects being arranged in a pattern corresponding to conversion of said plurality of residue digits into said plurality of mixed base digits;

triggering detectors in each of said plurality of digit converters;

outputting from each triggered detector one of a plurality of output signals, said one of a plurality of output signals corresponding to a value of one of said plurality of mixed base digits.

15. A method as claimed in claim 14 above, wherein:

said activated sources generate or transmit electrical signals;

said plurality of interconnects transmit electrical signals; and said plurality of detectors detect electrical signals.

16. A method as claimed in claim 14 above, wherein:

said activated sources generate or transmit optic signals;

said plurality of interconnects transmit optic signals; and said plurality of detectors detect optic signals.

17. A method as claimed in claim 14, wherein:

the number of said plurality of sources within each of said plurality of digit converters is equal to the sum of residue number system moduli associated with that digit converter;

the number of said plurality of detectors within each of said plurality of digit converters is equal to the product of residue number system moduli associated with that digit converter;

detectors within a digit converter are set to trigger at trigger values of N.I, N corresponding to the significance of the mixed base digit associated with that digit converter and I corresponding to one of a magnitude and an intensity of a signal generated from a source; and sources associated with residue number values of q are connected, via said plurality of interconnects, to a (q+1)-th detector and every k-th detector from said (q+1)-th detector, k being the modulus of an associated residue digit.

* * * * *